US010460057B2

(12) United States Patent
Li

(10) Patent No.: US 10,460,057 B2
(45) Date of Patent: Oct. 29, 2019

(54) APPARATUS AND METHOD FOR MODELLING A MODULAR MULTILEVEL CONVERTER IN AN ELECTRONIC SIMULATOR

(71) Applicant: Wei Li, Laselle (CA)

(72) Inventor: Wei Li, Laselle (CA)

(*) Notice: Subject to any disclaimer, the term of this patent is extended or adjusted under 35 U.S.C. 154(b) by 365 days.

(21) Appl. No.: 15/330,572

(22) Filed: Oct. 13, 2016

(65) Prior Publication Data
US 2017/0132337 A1     May 11, 2017

Related U.S. Application Data

(60) Provisional application No. 62/285,835, filed on Nov. 10, 2015.

(51) Int. Cl.
*G06F 17/50* (2006.01)
*H02M 7/219* (2006.01)

(52) U.S. Cl.
CPC ...... *G06F 17/5036* (2013.01); *G06F 17/5027* (2013.01); *H02M 7/219* (2013.01)

(58) Field of Classification Search
CPC .. H02M 7/219; H02M 7/483; H02M 7/53873; H02J 3/1814; G06F 17/5009; H01L 31/02021
See application file for complete search history.

(56) References Cited

U.S. PATENT DOCUMENTS

| | | | | |
|---|---|---|---|---|
| 8,786,139 B2* | 7/2014 | Cummings | ....... | H01L 31/02021 307/151 |
| 8,837,185 B2* | 9/2014 | Goerges | ............ | H02M 7/53873 363/127 |
| 9,413,260 B1* | 8/2016 | Wu | ........................ | H02M 7/483 |

(Continued)

FOREIGN PATENT DOCUMENTS

EP    2882089 A1 *  6/2015  ............ H02M 7/483

OTHER PUBLICATIONS

Li et a., "Protection of Nonpermanent Faults on DC Overhead Lines in MMC-Based HVDC Systems", IEEE 2013.*
(Continued)

*Primary Examiner* — Kandasamy Thangavelu
(74) *Attorney, Agent, or Firm* — Rama B Nath

(57) ABSTRACT

Method and apparatus for simulating a MMC system in an electronic simulator uses a computing unit and a connected input/output interface. The electronic simulator comprises a simulation model of a modular multilevel converter (MMC) system including at least one MMC valve, each MMC valve including a plurality of connected converter-submodules (SMs), each SM preferably comprising at least two controlled switches, a capacitor and auxiliary switches. The inventive approach replaces each MMC valve by an equivalent circuit whereby each SM in the valves may be solved separately. Multiple computing units are used to simulate those SMs in parallel, thus achieving fast or real-time simulation speed. The computing unit may comprise multiple computing means using CPU cores, FPGA or GPU cores and combinations thereof. The present inventive method keeps the model-detail including its precision, and enables a real time simulator to achieve fast or real-time speed for very large MMC system-simulations.

20 Claims, 9 Drawing Sheets

MMC HVDC and Half Bridge Submodule

(56) References Cited

U.S. PATENT DOCUMENTS

| | | | | |
|---|---|---|---|---|
| 2012/0191391 | A1* | 7/2012 | Angquist | H02M 7/483 702/64 |
| 2014/0129195 | A1* | 5/2014 | He | G06F 17/5009 703/2 |
| 2014/0362622 | A1* | 12/2014 | Nademi | H02M 7/219 363/78 |
| 2015/0162848 | A1* | 6/2015 | Harnefors | H02J 3/1814 363/78 |

OTHER PUBLICATIONS

Can Wang, "Modular Multilevel Converter HVDC Based on Harmonic Function Analysis", McGill University, Aug. 2014.*

Jung et al., "A cell capacitor energy balancing control of modular multilevel converter considering unbalanced AC Grid conditions", The 2014 Intl. Power electronics conference.*

Dennetière et al., "Modeling of Modular Multilevel Converters for the France-Spain link", The International Conference on Power Systems Transients, Jul. 2013.*

Gowaid et al., "Analysis and Design of a Modular Multilevel Converter With Trapezoidal Modulation for Medium and High Voltage DC-DC Transformers", IEEE 2015.*

[Ahmed] N. Ahmed, L. Angquist, S. Norrga, H.-P. Nee, "Validation of the continuous model of the modular multilevel converter with blocking/deblocking capability," 10th IET International Conference on AC and DC Power Transmission (ACDC 2012), 6 pp., 2012.

[Venjakob] O. Venjakob, S. Kubera, R. Hibberts-Caswell, P.A. Forsyth, T.L. Maguire, "Setup and Performance of the Real-Time Simulator used for Hardware-in-Loop-Tests of a VSC-Based HVDC scheme for Offshore Applications", Proceedings of International Conference on Power Systems Transients (IPST'13), Vancouver, Canada, Jul. 18-20, 2013.

[Dommel] H. W. Dommel, "Digital Computer Solution of Electromagnetic Transients in Single and Multi-phase Networks," IEEE Trans. Power App. Syst., vol. PAS-88, No. 4, pp. 388-399, Apr. 1969.

[Gnanarathna] U. N. Gnanarathna, A. M. Gole, and R. P. Jayasinghe, " Efficient Modeling of Modular Multilevel HVDC Converters (MMC) on Electromagnetic Transient Simulation Programs," IEEE Trans. on Power Delivery, vol. 26, No. 1, pp. 316-324, Jan. 2011.

[Le-Huy] P. Le-Huy, P. Giroux, J.-C. Soumagne , "Real-Time Simulation of Modular Multilevel Converters for Network Integration Studies," International Conference on Power Systems Transients, Delft, Netherlands Jun. 14-17, 2011.

[Saad] H. Saad, C. Dufour, J. Mahseredjian, S. Dennetière, S. Nguefeu, "Real Time simulation of MMCs using the State-Space Nodal Approach," Proceedings of International Conference on Power Systems Transients (IPST'13), Vancouver, Canada, Jul. 18-20, 2013.

[Dufour] C. Dufour, J., Mahseredjian, J., Belanger, "A Combined State-Space Nodal Method for the Simulation of Power System Transients", IEEE Transactions on Power Delivery, vol. 26, No, 2, pp. 928-935, 2011.

[Maguire] T. L. Maguire, B. Warkentin, Y. Chen, and J. Hasler, "Efficient Techniques for Real Time Simulation of MMC Systems", Proceedings of International Conference on Power Systems Transients (IPST'13), Vancouver, Canada, Jul. 18-20, 2013.

* cited by examiner

Real Time simulator connected to a Controller under test (PRIOR ART)

MMC HVDC and Half Bridge Submodule

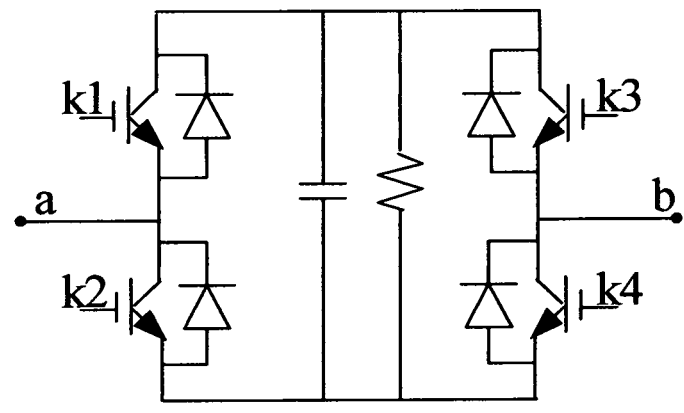
Fig3(a) full-bridge SM
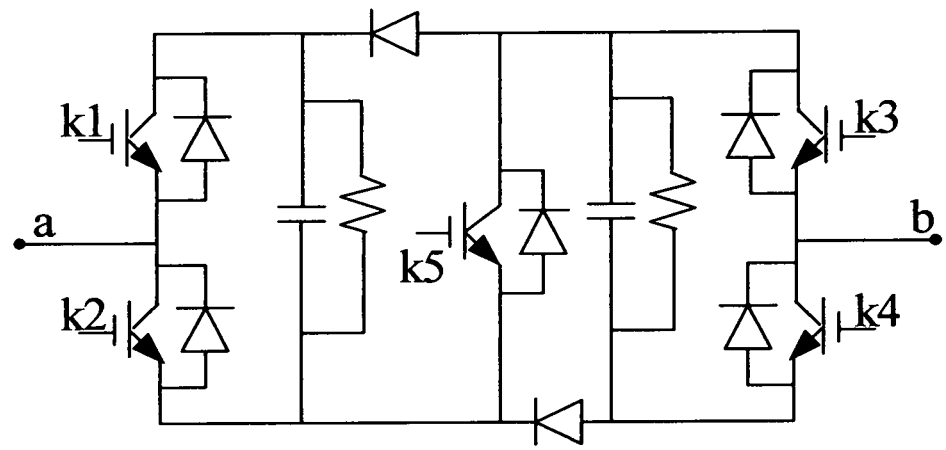
Fig3(b) Double-Clamp SM
Schematic of Full Bridge SM and Double Clamp SM

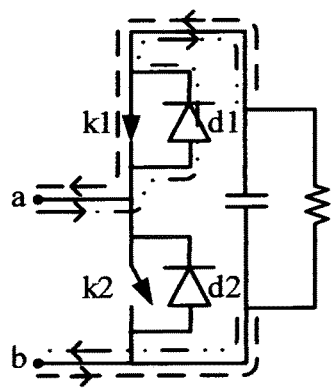
Fig 4(a)
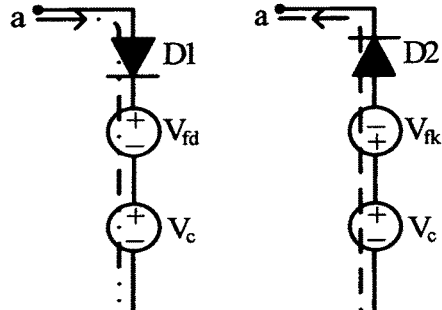
(a-1)　　(a-2)
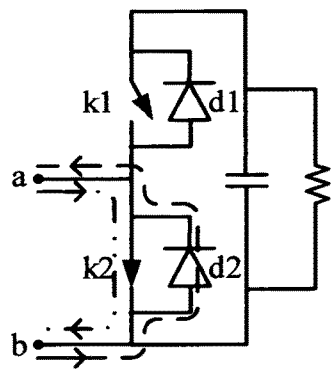
Fig 4(b)
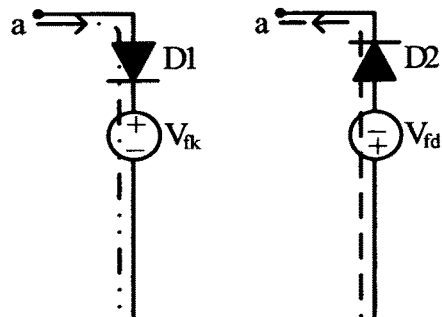
(b-1)　　(b-2)
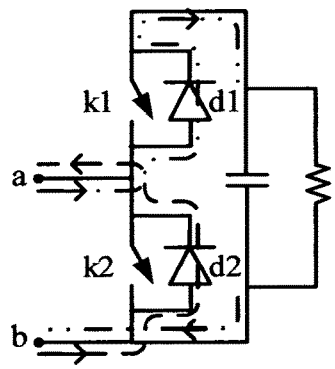
Fig 4(c)
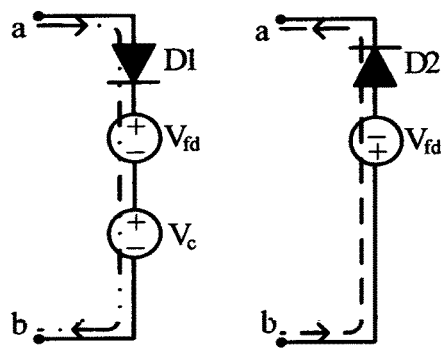
(c-1)　　(c-2)
Equivalent circuits of HBSM at different modes

Submodule Equivalent Circuit

Equivalent Circuit of a stack of SM

Equivalent circuit of MMC valve

Use of Equivalent Circuit in solving MMC system circuit

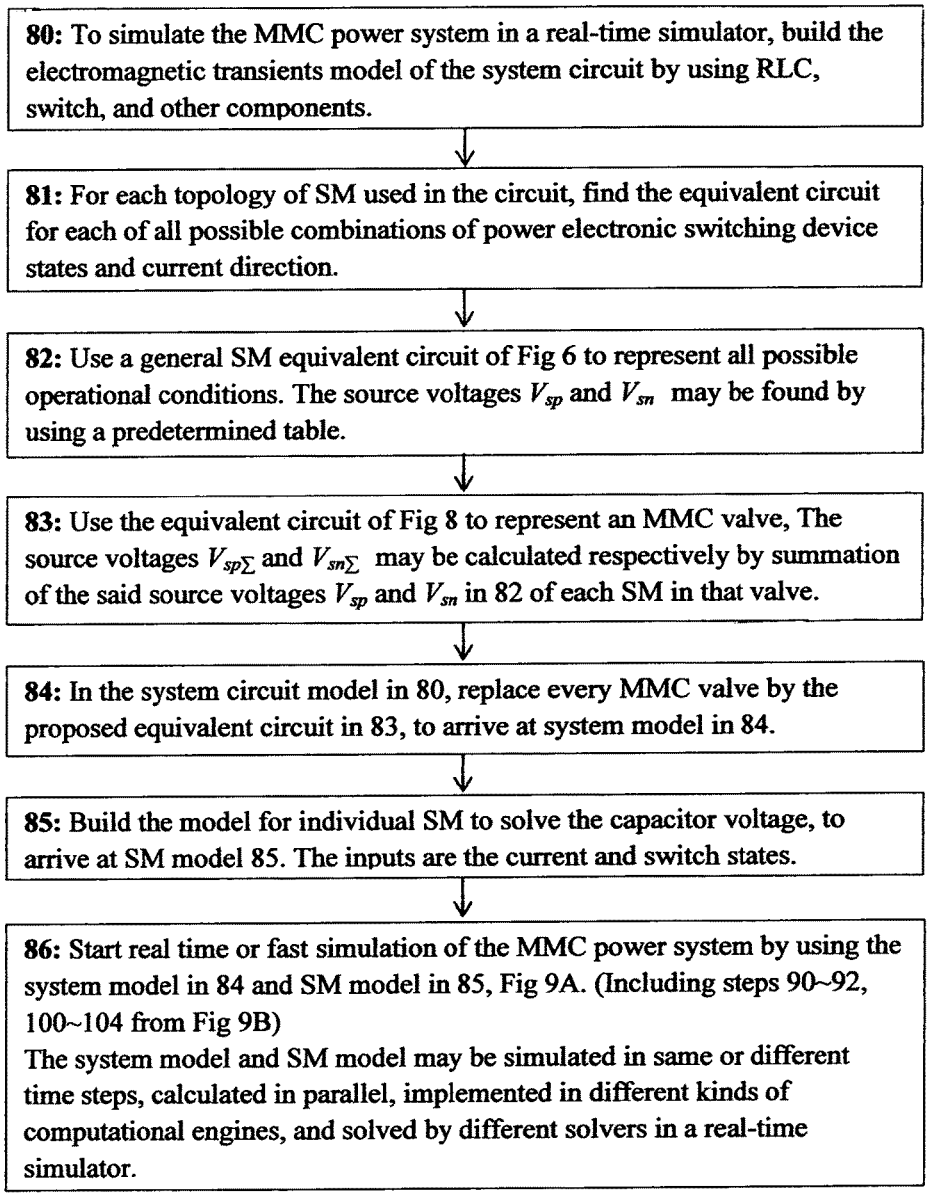

80: To simulate the MMC power system in a real-time simulator, build the electromagnetic transients model of the system circuit by using RLC, switch, and other components.

81: For each topology of SM used in the circuit, find the equivalent circuit for each of all possible combinations of power electronic switching device states and current direction.

82: Use a general SM equivalent circuit of Fig 6 to represent all possible operational conditions. The source voltages $V_{sp}$ and $V_{sn}$ may be found by using a predetermined table.

83: Use the equivalent circuit of Fig 8 to represent an MMC valve, The source voltages $V_{sp\Sigma}$ and $V_{sn\Sigma}$ may be calculated respectively by summation of the said source voltages $V_{sp}$ and $V_{sn}$ in 82 of each SM in that valve.

84: In the system circuit model in 80, replace every MMC valve by the proposed equivalent circuit in 83, to arrive at system model in 84.

85: Build the model for individual SM to solve the capacitor voltage, to arrive at SM model 85. The inputs are the current and switch states.

86: Start real time or fast simulation of the MMC power system by using the system model in 84 and SM model in 85, Fig 9A. (Including steps 90~92, 100~104 from Fig 9B)
The system model and SM model may be simulated in same or different time steps, calculated in parallel, implemented in different kinds of computational engines, and solved by different solvers in a real-time simulator.

Flowchart of method

Fig 9A

Flowchart of simulation steps

APPARATUS AND METHOD FOR MODELLING A MODULAR MULTILEVEL CONVERTER IN AN ELECTRONIC SIMULATOR

RELATED APPLICATIONS

This application claims priority from U.S. provisional application 62/285,835 filed on 10 Nov. 2015, the contents of which are incorporated herein by reference.

BACKGROUND OF THE INVENTION

A real-time simulator is a device that emulates the real-time behaviour of a system or apparatus at real-life speed. Real-time simulators comprise elements that are typically based on computers or similar digital computing devices that compute the apparatus-governing-equations, which typically include a set of Differential-Algebraic Equations (DAEs). Practically, the system/apparatus may comprise 'controlled devices', meaning that they normally work in conjunction with a controller. The controller has the objective of effectively controlling the apparatus within certain objectives and requirements. In real life, the performance of the device (also known as the 'plant') is controlled by accepting the commands of the controller. The controller adjusts its commands by reading the device parameters/states (e.g., currents, position, speed). Expediently, the controller and controlled devices are connected in a closed-loop. The study of the behaviour of a controlled device and a controller connected in a closed-loop is a complex subject. Although basic PID (Proportional Integral Derivative) control can be studied using analytical methods, non-linear behaviour, fault modes and protection considerations add to the complexity so much that it becomes significantly difficult to validate a controller analytically.

By using a real-time simulator, engineers can test and validate the control laws of the controller in a safe environment, without risk of injuries, by replacing the real apparatus by a virtual one (especially in high power applications such as ships, planes, electric plants or grids). Simulators are often used also in cases where it is not even possible to use a real plant, for example to test protection limits in borderline conditions.

The real-time simulator itself generally comprises two main parts: a computing unit/means (—CPU, FPGA, GPU, or a combination of these—) {FPGA is Field Programmable Gate Array}, running-models of a simulated apparatus and an input/output (I/O) interface. These I/Os connect the simulated controlled device to the controller under test. These I/Os are typically sets of analog inputs and outputs, and digital inputs and outputs. For example, the digital input will read the controller pulse that drives a switching converter (—power electronic converter—) simulated in the real-time simulator. Current and voltage values of the switching converter will be sent to the analog output of the simulator so that these values can be read by the controller. I/Os are required to close the loop between the real controller in the real world and the emulated controlled device. To synchronize the real-time simulator at real world time, the real-time simulator includes an internal clock, which can come from an I/O device or be generated by the operating system. It is also noted that the computing unit must be fast enough and/or use fast-enough algorithms to be able to compute and iterate the model states and outputs at the real-time pace. This is necessary to enable interaction with a real device connected to the I/O of the simulator.

Real-time simulation technologies are nowadays an integral part of the design and test process of many types of electric systems like large power grids, power converters and variable speed drives. These modern design approaches mitigate the risks through extensive use of technologies like Hardware-In-the-Loop (HIL) simulation and the model-based design approach. In HIL simulation, a plant controller is tested against a real-time simulated model of the plant. HIL simulation technologies enable more gradual integration, while diminishing the risk, and costs of such projects. Also, in HIL simulation, more elaborate test coverage can be achieved than is possible using analog prototypes because of the safe operational limits of real power electronic devices and power plants.

Non Real-Time Applications of Real-Time Simulator

FIG. 1, explained in more detail later, shows representative real-time simulator usage in HIL with a controller under test. A real-time simulator can also be used without externally-connected controllers. This is the case in tests involving batch testing, and what is known as Monte-Carlo testing, with a large number of statistically varying test-cases. Note that Monte-Carlo tests can also be made in HIL mode. For example, this approach is used by utilities to correctly assess the protection of a power system. In this case, the same real-time solvers can be used, and the internal clock can be adjusted to suit the actual computation-time of the solver. Such usage of the simulator is sometimes viewed as being faster-than-real-time because in small power electronic systems it can result in simulation that is faster than in real-time. All applications of real-time simulators are therefore generally applicable to non-real-time simulators as well.

Human-in-the-Loop Simulation

Real-time simulators are also often used to train operators with real-time simulated devices computed on the real-time simulator. This is generically similar to the configuration in FIG. 1 except that the 'controller' can be a human person with I/Os adapted for human perception and actions. These I/Os may in this case be a graphical display, a keyboard, or a joystick, or the like.

Real-Time Simulation of Switched Power Electronic Systems

Real-time simulation of power converters is however very challenging for several reasons. The source of the challenge lies in the mandatory use of fixed-step solvers in a real-time simulator. Typical power converters are composed of a large number of switching devices operating at commutation frequencies that can be very high with regard to the sampling time of the real-time simulator. For example, it is not uncommon presently to commission power grid devices called FACTS devices with several hundred switches. These switches then create a large number of electrical modes that are difficult to compute using the class of real-time solvers. Second, the sampling time of the real-time simulator may be insufficient to correctly sample the PWM waveforms that often drive these converters. Additionally, many power converter configurations create instantaneous switching events that are hard to handle with non-iterative solvers. A good example of a converter that induces instantaneous events is the boost converter, wherein when the IGBT (Insulated Gate Bipolar Transistor) opens, the diode turns on immediately.

Finally, it is important to understand that these challenges are partly caused by speed limitations of the computational hardware presently available. In that regard, two main classes of hardware are used presently to design real-time simulation of power converter circuits: CPUs (as part of a computer system) and FPGAs. Each class of hardware has pros and cons. The structure of CPUs allows them to implement complex algorithms and solvers. Also, the use of high-level languages like 'C' for example, facilitates their implementation. However, the costs of conversion to machine-code (i.e. compilation), as well operating system latencies limit this approach to certain sample-times. On the other hand, this sample-time can go down to 5-10 nanoseconds in FPGAs (1000 times lower than the sample time in CPUs) but their internal structure limits the use of complex solvers and favors simpler ones.

Modular Multilevel Converter (MMC)

MMC as understood herein is a power converter, and in one form includes multiple MMC valves which are comprised of multiple sub-modules (SMs). There are different SM topologies, such as but not limited to half-bridge, full-bridge, and double-clamped arrangements.

The modular multilevel converter (MMC) as generally illustrated in FIG. 2, is a type of voltage source converter, showing a MMC HVDC circuit embodying several half-bridge sub-modules (HBSMs). As illustrated, a monopole MMC HVDC system has 6 valves in one terminal, with each valve consisting of a number of identical but independent converter sub-modules (SM) connected in series. One form of the SM, usually identified as half-bridge sub-module (HBSM), comprises two switches, a capacitor, and other auxiliary circuits (such as the bypass switch, discharge resistor, and protection means for capacitor over-voltage protection). Each of the two switches may comprise an IGBT and an anti-parallel diode. Depending on the state of the two switches (—open/close state—) the SM can produce a 2-level DC voltage output, either '0' volts or the capacitor voltage.

The SMs in a valve are controlled independently and therefore the MMC valve can produce a multi-level voltage output, the level depending on the switch states, which are in turn set by an MMC controller. There are a few other SM variants used in a variety of different applications. It is understood that SMs can be in different configurations with different topologies. The present invention is applicable to all SM configurations. Further, it is noted that the different SM configurations are known to those skilled in the art. FIGS. 3(a),3(b) illustrate two examples of SM configuration variants, namely, the Full-Bridge-Sub-Module (FBSM) and Double-Clamp-Sub-Module (DCSM). The FBSM can be in a STATCOM application. As shown, FIGS. 3(a),3(b) illustrate the schematic of a FBSM and a DCSM. It is noted that the DCSM and FBSM configurations are capable of modes in excess of four modes unlike the case of the HBSM of FIGS. 4(a), 4(b), 4(c). The present invention is explained in light of the specific example of HBSM, noting that all SM configurations are within the ambit of the present invention.

To simulate the MMC system in real time is critical for testing the MMC controller using hardware-in-the-loop simulation. It is to be noted that a typical MMC project/ circuit can have more than 200 SMs in each valve, and consequently requires a few thousand IGBTs in the circuit. Therefore, to simulate the MMC system with a full detailed model will be time-consuming and it is also difficult to reach real time simulation speed.

SUMMARY OF THE INVENTION

Conventional simulators or simulation programs have deficiencies in simulating a power system comprising a MMC with fast or real time simulation speed. Some methods are proposed in prior art to improve the speed of simulation of MMCs in a power system.

The present invention proposes to accelerate the simulation of the MMC system by applying certain equivalent-circuit models. In one form the invention provides a dual-diode-branch equivalent circuit model for an MMC valve, which enables parallel calculation to increase simulation speed and still keep the model detail and precision. With the inventive use of the equivalent circuit, very large MMC systems can be simulated in real time by executing multiple simulation tasks in parallel using multiple parallel computing units (e.g. CPU cores or FPGA resources) in the real time simulator. The present invention is useful in non-real-time applications as well.

The present invention comprises at least the following features:

a. An equivalent circuit, such as for example in FIG. 5, is used as a functional and mathematical replacement of the MMC valve, which could be in the form of a Half-bridge (HB), or full-bridge (FB), or double-clamped (DC), or other sub-module (SM) topologies.

b. The parameters of the equivalent circuit (including the voltage value of the voltage sources) can be ascertained by solving the individual sub-modules (SMs) in the valves.

c. Solving the MMC system where the MMC valves are replaced by the chosen equivalent circuits is much easier and faster functionally. It is advantageous to find the right equivalent circuit in each case so that the MMC system can be simulated with greater efficiency as desired. Additionally, solving the MMC system with the equivalent circuits, and solving individual SMs can be in parallel, when multiple calculation units (CPU cores, FPGA, or GPU cores) are used.

The invention focuses on finding the preferred/right equivalent circuit, so that the MMC system valves can be simulated in parallel, faster, and without loss of necessary details.

In one form, the invention relates to apparatus and method for simulating a modular multilevel converter (MMC) system such that the simulating speed is increased without sacrificing model-detail and precision. In an electronic simulator of the type that uses a computing unit and a connected input/output interface, said simulator including a computing unit and a connected input/output interface, said simulator comprising a model of a MMC system including at least one MMC valve with AC input and wired to produce different levels of DC output, or alternatively, DC input and wired to produce different levels of AC output, said MMC valve including a plurality of connected converter submodules (SMs), each SM comprising at least two controlled switches, a capacitor and auxiliary switches, wherein a programmed computing unit for simulating said MMC system is used, and wherein the inventive method comprises the method-steps of:

(a) ascertaining a status of each of said SMs chosen from SM configurations including Full Bridge SM and Double Clamp SM configurations and further including a Half Bridge SM configuration that comprises: insert mode, bypass mode, diode mode and fault mode, (b) representing each of said SMs by an equivalent circuit for each said mode according to a current-direction of said DC output, each said equivalent circuit including series connected elements/components selected from (i) an ideal diode (ii) diode forward conduction voltage $V_{fd}$ (iii) switch forward conduction voltage $V_{fk}$ and (iv) voltage $V_c$ of said capacitor, (c) solving a predetermined capacitor-voltage-equation to arrive at the capacitor voltage $V_c$ and;

(d) compiling voltage values of source voltages $V_{sp}$ and $V_{sn}$ for said different modes of each said SM by using capacitor voltage values $V_c$ The method step of using a programmed computing unit in the above method may comprise using a computing unit/means chosen from a group consisting of a CPU, FPGA, GPU and a combination thereof.

The method step of compiling values of said source voltages $V_{sp}$ and $V_{sn}$ may be done by using a predetermined table for different states of said switches, said different states being chosen from "open and close".

The method steps as above may include the step of programing the computing unit to handle a plurality of said MMC valves, each MMC valve including a plurality of half bridge SM, each SM comprising two controlled switches. Alternatively, the method may include the step of programing the computing unit to handle a plurality of said MMC valves, each MMC valve including a plurality of full bridge SM, each said full bridge SM comprising four controlled switches.

The method step of programing the computing unit may be configured to handle controlled switches that are in the form of IGBTs.

The method step of representing each of said SMs in the above method may comprise representing DCSMs.

Inventive apparatus as described herein preferably uses a programmed computing unit which may comprise computing means chosen from a group consisting of a CPU, FPGA, GPU or the like and a combination thereof. The programmed computing unit is preferably programmed to compile values of said source voltages $V_{sp}$ and $V_{sn}$ which may be done with the assistance of a predetermined table for different states of said switches, said different states being chosen from "open and close". The programmed computing unit may be one that is programmed to handle a plurality of MMC valves referred to above, each MMC valve including a plurality of half bridge SM, each half bridge SM comprising two controlled switches. Alternatively, the programmed computing unit may be a unit that is programmed to handle a plurality of said MMC valves, each MMC valve including a plurality of full bridge SM, each full bridge SM comprising four controlled switches.

The programmed computing unit may be one that is configured to handle controlled switches that are in the form of IGBTs.

The programmed computing unit may be one that is configured to handle said SMs which might comprise DCSMs.

BRIEF DESCRIPTION OF THE DRAWINGS

A more detailed understanding of the invention may be had from the following description of preferred exemplary embodiments, not intended to be limiting, and to be understood in conjunction with the accompanying drawing wherein:

FIG. 3(a) shows an exemplary schematic of full bridge SM and FIG. 3(b) shows a Double-Clamp SM.

FIGS. 4(a), 4(b) and 4(c) illustrate exemplary equivalent circuits of HBSM at different modes.

DETAILED DESCRIPTION OF PREFERRED EMBODIMENTS

A detailed description of one or more embodiments of the invention is provided below in the context of the accompanying figures that illustrate by way of example the principles of the invention. While the invention is described in connection with such embodiments, it should be understood that the invention is not limited to any particular embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention.

The present invention may be practiced according to the claims without some or all of these specific details. For purposes of clarity, technical material that is known in the technical fields related to the invention has not been described in detail so that the present invention is not unnecessarily obscured.

Figure 1:
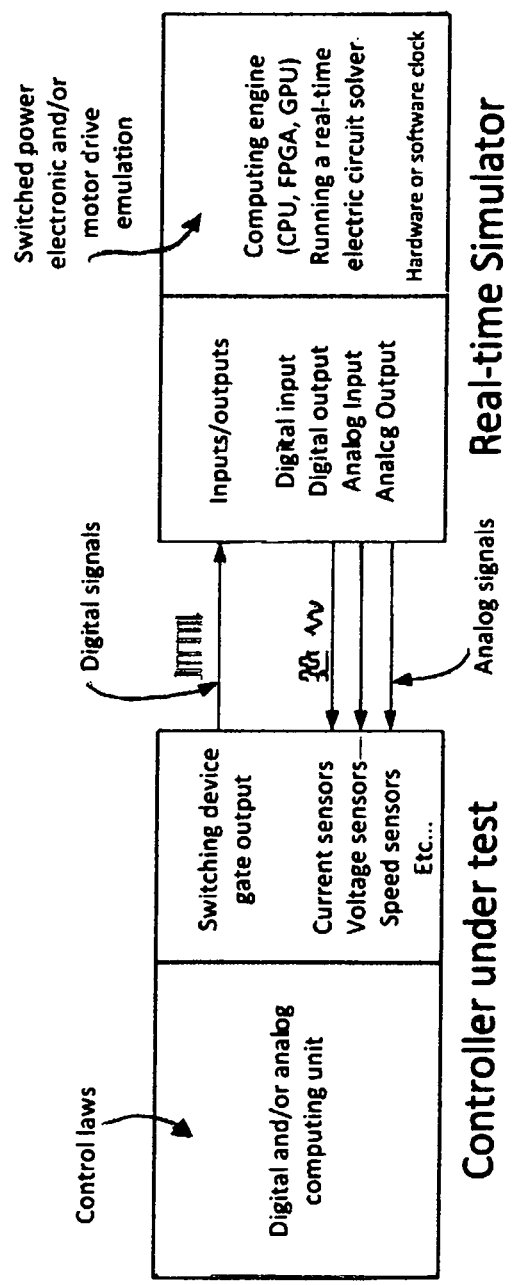
FIG. 1 shows an illustration of a real-time simulator connected to a controller under test FIG. 2 diagrammatically illustrates a MMC HVDC converter and half-bridge submodule.
Figure 2:
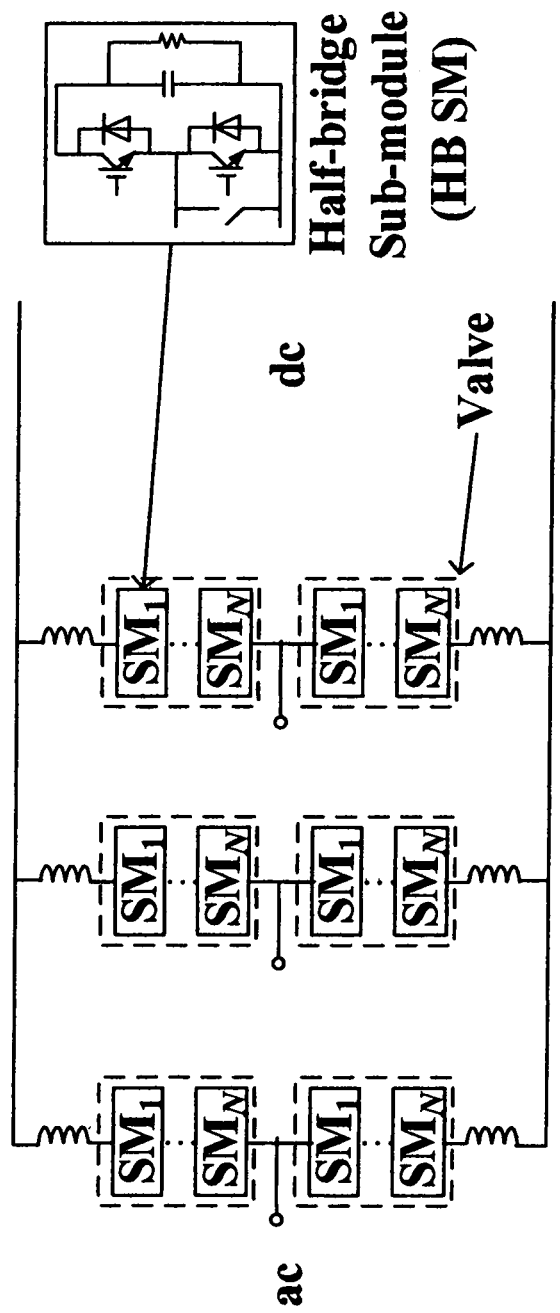
Figure 5:
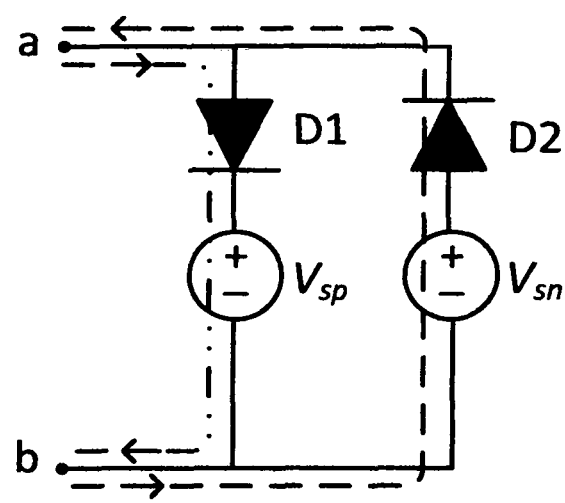
FIG. 5 shows an exemplary sub-module equivalent circuit.
Figure 6:
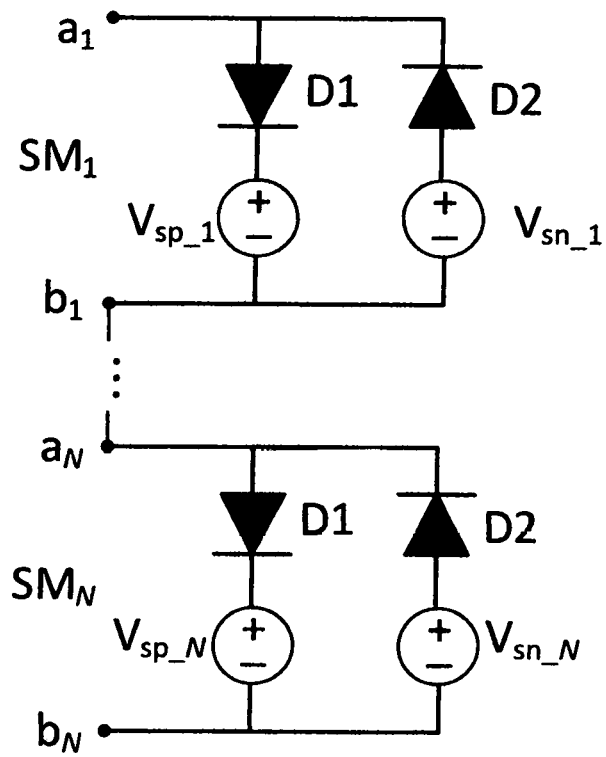
FIG. 6 shows an example of an equivalent circuit of a stack of SMs.
Figure 7:
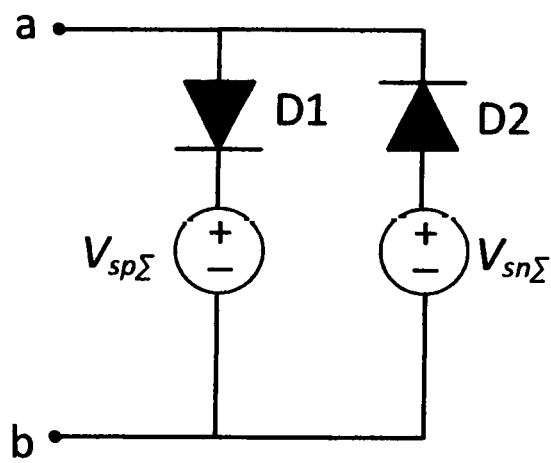
FIG. 7 shows an exemplary equivalent circuit of an MMC valve.

FIG. 1 generally illustrates a prior art exemplary arrangement of a real-time simulator connected to a controller under test, and is self-explanatory. FIG. 2 is an exemplary illustration of a MMC HVDC system with a plurality of connected SMs accepting an AC input and producing a DC output, where each SM may comprise components exemplarily shown in the inset of FIG. 2. FIGS. 3(a),3(b) illustrate a schematic of a full-bridge configuration as exemplarily shown in FIG. 3(a) and a double-clamp SM as exemplarily shown in FIG. 3(b). It is noted that the number of possible operational modes for the FIG. 3(a), 3(b) configuration is not limited to four modes that apply in FIGS. 4(a), 4(b), 4(c) which show a Half Bridge SM at different modes. FIG. 5 illustrates an exemplary SM equivalent circuit. FIG. 6 illustrates an exemplary equivalent circuit of a stack of SMs. In one form, the essence of the present invention comprises the use of dual-diode-branch equivalent circuit models for an MMC valve (as illustrated in FIG. 7), along with equivalent circuit models for SMs. Depending on the IGBT states and the current direction, the current takes different paths in the SM, and consequently the SM has different output voltages. Taking the HBSM as an example, the SM can be in one of the four modes, namely the insert, bypass, diode, and fault modes according to the switch states as in Table 1 for example.

In the insert mode, the SM can be represented by the equivalent circuit in either FIG. 4 (*a*-1) or (*a*-2) according to the current direction. In FIGS. 4, D1 and D2 are ideal diodes, $V_{fd}$ and $V_{fk}$ are respectively the diode forward conduction voltage and IGBT forward conduction voltage; $V_c$ is the capacitor voltage. Similar to the insert mode, the SM equivalent circuits in bypass mode and diode mode are shown in FIGS. 4(*a*), 4(*b*), 4(*c*). The fault mode is forbidden under normal operation, where the capacitor is discharged by a very large short circuit current. The equivalent circuit in the fault mode is similar to the bypass mode with capacitor voltage being discharged to zero. Thus, the SM can be represented by an equivalent circuit with two diode branches for all modes as shown in FIG. 5, where source voltages $V_{sp}$ and $V_{sn}$ may be achieved as in Table 1 for HBSM. Solving for the capacitor voltage $V_c$ is explained in a later section.

TABLE I

Source voltages in HB SM Equivalent Circuit

| Mode | k1 | k2 | $V_{sp}$ | $V_{sn}$ |
|---|---|---|---|---|
| Insert | 1 | 0 | $V_c + V_{fd}$ | $V_c - V_{fk}$ |
| Bypass | 0 | 1 | $V_{fk}$ | $-V_{fd}$ |
| Diode | 0 | 0 | $V_c + V_{fd}$ | $-V_{fd}$ |
| Fault | 1 | 1 | $V_{fk}$ | $-V_{fd}$ |

Note that the equivalent circuit works for all other SM variants. For example, the equivalent circuit can represent the FBSM when the $V_{sp}$ and $V_{sn}$ are achieved as in Table II.

TABLE II

Source Voltages in FB SM Equivalent Circuit

| mode | k1 | k2 | k3 | k4 | $V_{sp}$ | $V_{sn}$ |
|---|---|---|---|---|---|---|
| positive insert | 1 | 0 | 0 | 1 | $V_c + 2V_{fd}$ | $V_c - 2V_{fk}$ |
| negative insert | 0 | 1 | 1 | 0 | $-V_c + 2V_{fk}$ | $V_c + 2V_{fd}$ |
| bypass | 1 | 0 | 1 | 0 | $V_{fk} + V_{fd}$ | $-V_{fk} - V_{fd}$ |
|  | 0 | 1 | 0 | 1 |  |  |
| diode | 0 | 0 | 0 | 0 | $V_c + 2V_{fd}$ | $-V_c - 2V_{fd}$ |
| hybrid | 0 | 0 | 1 | 0 | $V_{fk} + V_{fd}$ | $-V_c - 2V_{fd}$ |
|  | 0 | 1 | 0 | 0 |  |  |
|  | 1 | 0 | 0 | 0 | $V_c + 2V_{fd}$ | $-V_{fk} - V_{fd}$ |
|  | 0 | 0 | 0 | 1 |  |  |

Series connection of the SM equivalent circuits gives the equivalent circuit of the MMC valve, as shown in FIG. 6, which illustrates the equivalent circuit of a stack of SMs. As the multiple ideal diodes in the same current direction can be replaced by one diode and the multiple voltage sources behind the diode can be replaced by one voltage source, the valve equivalent circuit can be further simplified as two controllable voltage sources behind two diodes, as shown in FIG. 7. Each source voltage value, $V_{sx\Sigma}$, is the summation of the individual SM source voltages, $V_{sx-i}$, in the same direction, as in equation (1), where N is the number of SMs in a valve.

$$V_{sx\Sigma} = \sum_{i=1}^{N} V_{sx-i}, \text{ where } x = p, \text{ or } n; \text{ [see paragraph 23(}d\text{) above]} \quad (1)$$

Figure 8:
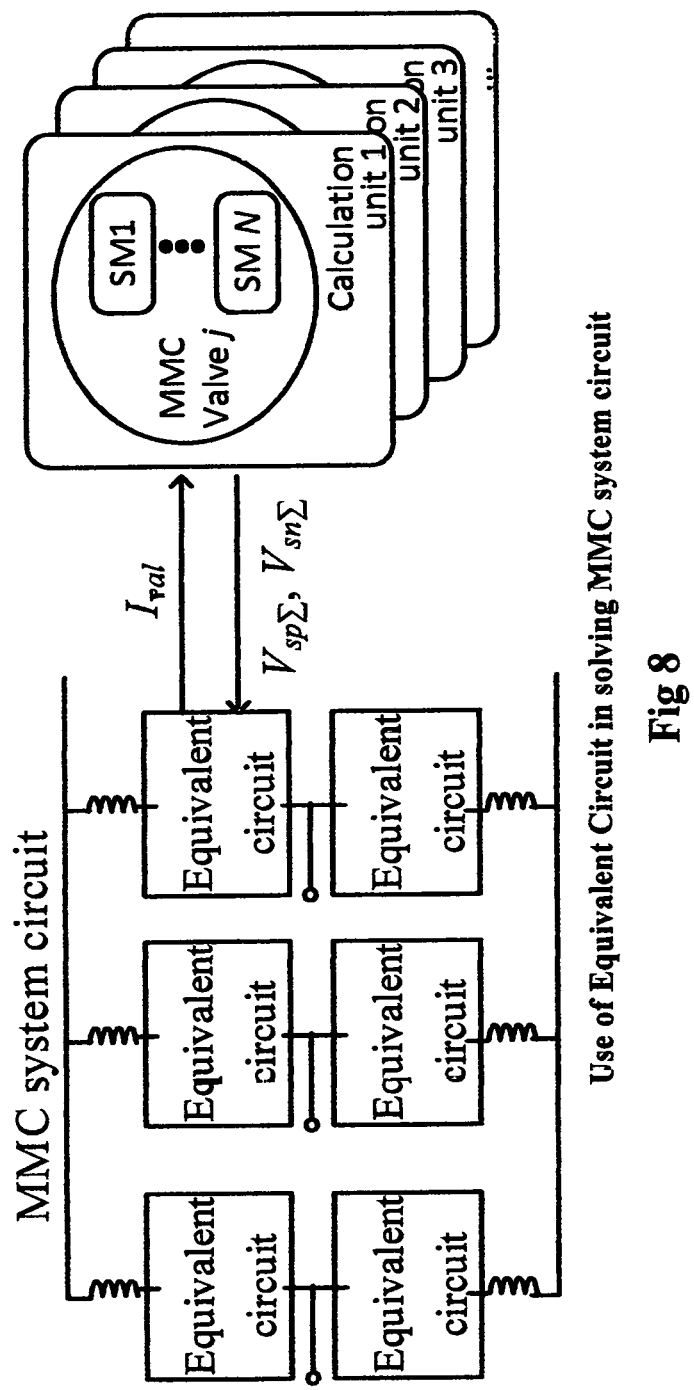
FIG. 8 shows an example of the use of the equivalent circuit solving an MMC system circuit in parallel using multiple calculation units.

As described and illustrated herein, the MMC system can be simulated with the valves being replaced by the equivalent circuit and each SM in the valves may be solved separately, as shown in FIG. 8. It is noted that FIG. 8 shows the use of equivalent circuit for solving the MMC system circuit when multiple computing units are used to simulate those SMs in parallel, thus achieving fast or real-time simulation speed.

As each SM is decoupled from the system circuit, the SM capacitor voltage can be solved individually. One method is to write a differential equation of the capacitor voltage from circuit analysis since the circuit of a single SM is simple. The equation for HBSM and FBSM is given in (2), where $V_c$ is the capacitor voltage; $I_c$ is the capacitor current; $C_{SM}$ is the SM capacitance; $i_{val}$ is the valve current; $R_{disc}$ is the discharge resistance; and k is a variable that depends on whether the valve current is flowing through the capacitor. For HBSM and FBSM, the value of k is defined in Table III and Table IV respectively. The positive direction is defined as the current flows into the terminal-a. Using forward-Euler method, (2) is discretized as (3) with a sampling time step of $T_s$.

$$V_c = \frac{1}{C_{SM}} \int i_c dt = \frac{1}{C_{SM}} \int \left( k * i_{val} - \frac{V_c}{R_{disc}} \right) dt \quad (2)$$

$$V_c(t + T_s) = V_c(t) + \frac{T_s}{C_{SM}} \left( k(t) i_{val}(t) - \frac{V_c(t)}{R_{disc}} \right) \quad (3)$$

TABLE III

Variable k in Capacitor Voltage Equation for HB SM

| Mode | k1 | k2 | Valve current direction | k |
|---|---|---|---|---|
| Insert | 1 | 0 | either | 1 |
| Bypass | 0 | 1 | either | 0 |
| Diode | 0 | 0 | positive | 1 |
|  |  |  | negative | 0 |

TABLE IV

Variable k in Capacitor Voltage Equation for FB SM

| mode | k1 | k2 | k3 | k4 | Valve current direction | k |
|---|---|---|---|---|---|---|
| positive insert | 1 | 0 | 0 | 1 | either | 1 |
| negative insert | 0 | 1 | 1 | 0 | either | -1 |
| bypass | 1 | 0 | 1 | 0 | either | 0 |
|  | 0 | 1 | 0 | 1 |  |  |
| diode | 0 | 0 | 0 | 0 | positive | 1 |
| hybrid | 0 | 0 | 1 | 0 | positive | 0 |
|  | 0 | 1 | 0 | 0 |  |  |
|  | 1 | 0 | 0 | 0 | positive | 1 |
|  | 0 | 0 | 0 | 1 |  |  |
| diode | 0 | 0 | 0 | 0 | negative | -1 |
| hybrid | 0 | 0 | 1 | 0 | negative | -1 |
|  | 0 | 1 | 0 | 0 |  |  |
|  | 1 | 0 | 0 | 0 | negative | 0 |
|  | 0 | 0 | 0 | 1 |  |  |

In another form, the invention also resides in a method as illustrated in exemplary flow-charts 9A (steps 80 to 86) and 9B (steps 90 to 104). It is noted that the steps in the exemplary flow-charts may be modified within the guidelines of the inventive method described herein.

Figure 9:
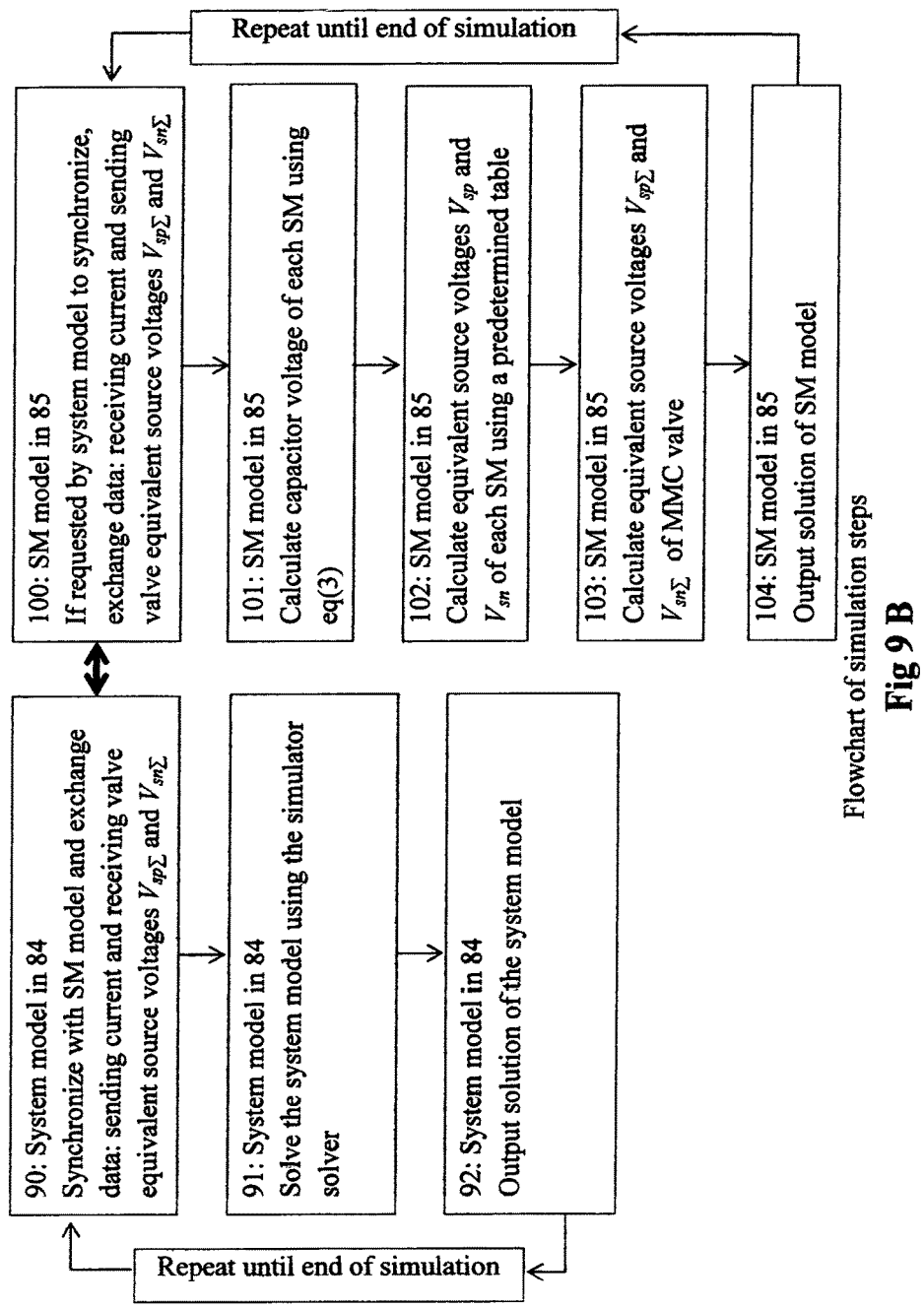
FIGS. 9A and 9B illustrate an example of a flow chart showing steps of a preferred method of implementing the invention.

Exemplary steps from flow-chart in FIG. 9A:

Step 80: To simulate the MMC power system in a real-time simulator, build the electromagnetic-transients-model of the system circuit by using RLC, switch, and other suitable desired components.

Step 81: For each topology of SM used in the circuit, find the equivalent circuit for each of all possible combinations of power electronic switching-device-states and current-direction.

Step 82: Use a general SM equivalent circuit of FIG. 6 to represent all possible operational conditions. The source voltages $V_{sp}$ and $V_{sn}$ may be found by using a predetermined table.

Step 83: Use the equivalent circuit of FIG. 8 to represent a MMC valve, The source voltages $V_{sp\Sigma}$ and $V_{sn\Sigma}$ may be calculated respectively by summation of the source voltages $V_{sp}$ and $V_{sn}$ in 82 of each SM in that valve.

Step 84: In the system circuit model in 80, replace every MMC valve by the proposed equivalent circuit in 83, to arrive at system model in 84.

Step 85: Build the model for individual SMs to solve the capacitor voltage, to arrive at SM model 85. The inputs are the current and switch states.

Step 86: Start real time or fast simulation of the MMC power system by using the system model in 84 and SM model in 85, FIG. 9A. (Including steps 90~92, 100~104 from FIG. 9B) The system model and SM model may be simulated in same or different time steps, calculated in parallel, implemented in different kinds of computational engines, and solved by different solvers in a real-time simulator.

Exemplary steps from flow-chart in FIG. 9B:

Step 90: System model in 84
Synchronize with SM model and exchange data: sending current and receiving valve equivalent source voltages $V_{sp\Sigma}$ and $V_{sn\Sigma}$ Step 91: System model in 84
Solve the system model using the simulator solver.

Step 92: System model in 84
For the output solution of the system model, from this step, repeat by returning to step 90 until the end of simulation is reached.

Step 100: SM model in 85
If requested by system model to synchronize, exchange data: receiving current and sending valve equivalent source voltages $V_{sp\Sigma}$ and $V_{sn\Sigma}$ Step 101. SM model in 85
Calculate capacitor voltage of each SM using eq (3).

Step 102: SM model in 85
Calculate equivalent source voltages $V_{sp\Sigma}$ and $V_{sn\Sigma}$ of each SM using a predetermined table.

Step 103: SM model in 85
Calculate equivalent source voltages $V_{sp\Sigma}$ and $V_{sn\Sigma}$ of MMC valve.

Step 104: SM model in 85
For the output solution of SM model from this step, repeat by returning to step 100 until the end of simulation is reached.

Variations to the described method and apparatus are envisaged to be within the ambit of the present invention if such variations can enable use of equivalent circuits for solving MMC system circuits as diagrammatically illustrated for example in FIG. 8

Comparison of the Present Invention with Certain Prior Art:

Some prior-art approaches to accelerate simulation of MMC systems include model simplification, such as in prior art publication of Ahmed [N. Ahmed, L. Angquist, S. Norrga, H.-P. Nee, "Validation of the continuous model of the modular multilevel converter with blocking/deblocking capability," 10th IET International Conference on AC and DC Power Transmission (ACDC 2012), 6 pp., 2012], and prior art publication of Venjakob [O. Venjakob, S. Kubera, R. Hibberts-Caswell, P. A. Forsyth, T. L. Maguire, "Setup and Performance of the Real-Time Simulator used for Hardware-in-Loop-Tests of a VSC-Based HVDC scheme for Offshore Applications", Proceedings of International Conference on Power Systems Transients (IPST'13), Vancouver, Canada, Jul. 18-20, 2013], where all capacitors in one valve are represented by one equivalent capacitor. Although the above prior art approaches may achieve relatively fast simulation speed, many details (e.g. individual capacitor voltages) are however lost in these prior art models.

In the prior art paper of Saad [H. Saad, C. Dufour, J. Mahseredjian, S. Dennetière, S. Nguefeu, "Real Time simulation of MMCs using the Combined State-Space Nodal Approach, in" Proceedings of International Conference on Power Systems Transients (IPST'13), Vancouver, Canada, Jul. 18-20, 2013], the approach proposed by Dufour is used to decouple the Norton equivalent of the MMC system, and each valve is calculated individually. The matrices have reduced dimensions and can be calculated in parallel. Still, large calculate power is required to solve MMC systems by the prior art methods.

In the prior art paper Maguire [T. L. Maguire, B. Warkentin, Y. Chen, and J. Hasler, "Efficient Techniques for Real Time Simulation of MMC System", Proceedings of International Conference on Power Systems Transients (IPST'13), Vancouver, Canada, Jul. 18-20, 2013], a surrogate network is used for each valve with three SM sections, i.e. blocked, unblocked, and bypassed. Each SM capacitor is represented by a Thevenin equivalent. The surrogate network for the half-bridge (HB) and full-bridge (FB) SM is different.

In abovementioned prior art works using the Norton or Thevenin equivalent methods, the equivalent circuits of the massive circuits or the surrogate networks have to be re-calculated whenever the switch-states change. Expediently, the present invention in one form uses the dual-diode-branch equivalent circuit of MMC valve to solve the system. The same equivalent circuit works for a valve consisting of SM of any types, HBSM, FBSM, DCSM, or other, or a combination of multiple types. No recalculation of the Norton or Thevenin equivalent is required in the present invention. Therefore, the present invention enables a faster speed compared to the Norton or Thevenin equivalent methods.

In summary, in one form, the essence of this invention comprises the use of dual-diode-branch equivalent circuit models for an MMC valve (as illustrated in FIG. 7), along with equivalent circuit models for SMs. Although the HBSM and FBSM are used as examples, this equivalent model works for all SM variants in the same principle. As the MMC valves containing thousands of switches are replaced by the dual-diode-branch equivalent circuit, the MMC system circuit becomes easier to solve (i.e. it requires less calculation power and is solved in less time). All SMs in the MMC valve can be solved separately and in parallel using multiple computing units, e.g. CPU cores or FPGA resources (as shown in FIG. 8; see calculation units 1, 2, 3, etc). Therefore, the present inventive method keeps the model-detail including its precision, and enables a real time simulator to achieve fast or real-time speed for very big MMC system simulations.

Further Applicability Details of the Invention
Non-Real-Time Application:

The invention can be used in non-real-time applications also to increase the simulation speed without downgrade of model detail and precision.

Applicable SM Variant Topologies:

This inventsion can be applied to any of SM variant topoglogies as long as the SM has a two-terminal topology.

Method of Solving SM Capacitor Voltage:

Although the circuit analysis and forward Euler numerical method of solving SM capacitor voltage has been used to describe the invention, the invention is applicable to any method which can solve the SM circuit to achieve the capacitor voltage.

Computational Engines:

The invention can by implemented in different kinds of computational engines in a real-time simulator: Microprocessors with Central Processing Unit (CPU), Field Programmable Gate Array (FPGA), Graphics Processing Unit (GPU) and others that can solve the MMC system circuit with the valve equivalent circuit and the SM circuit.

In the foregoing detailed description of embodiments of the invention, various features may have been grouped together in a single exemplary embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should therefore be determined with reference to the appended claims, along with the full scope of equivalents to which such claims are entitled. In the appended claims, the terms "including" and "in which" where present, are used as the plain-English equivalents of the respective terms "comprising" and "wherein," respectively. Moreover, the terms "first," " "second," and "third," etc., if used, are used merely as labels, and are not intended to impose numerical requirements on their objects.

The invention claimed is:

1. A computerized method in an electronic simulator of the type that uses a computing unit and a connected input/output interface, said simulator comprising a simulation model of a modular multilevel converter (MMC) system including at least one MMC valve with AC input and wired to produce different levels of DC output, or alternatively a DC input and wired to produce different levels of AC output, said MMC valve including a plurality of connected converter submodules (SM), each SM comprising at least two controlled switches, a capacitor and auxiliary switches, said method using a programmed computing unit for simulating said MMC system, said computerized method using programmed steps that comprise:

(a) ascertaining a status of each of said SMs chosen from SM configurations including Full Bridge SM and Double Clamp SM configurations and further including a Half Bridge SM configuration that comprise s: insert mode, bypass mode, diode mode and fault mode, using a predetermined table for obtaining values of positive source voltage $V_{sp}$ for path of positive current direction, and negative source voltage $V_{sn}$ for path of negative current direction, for each of said different modes of each SM by using a capacitor voltage value $V_c$ of said capacitor, (b) representing each of said SMs by a diode-branch-equivalent circuit for each of said four modes according to a current-direction of said DC output, each said equivalent circuit including series connected components selected from (i) an ideal diode (ii) diode forward conduction voltage $V_{fd}$ (iii) switch forward conduction voltage $V_{fk}$ and (iv) voltage $V_c$ of said capacitor, (c) solving a predetermined capacitor-voltage-equation to arrive at the capacitor voltage $V_c$, (d) obtaining summation source voltage values $V_{sp\Sigma}$ and $V_{sn\Sigma}$ by summation of said source voltages $V_{sp}$ and $V_{sn}$, and, (e) using an equivalent circuit to represent a MMC valve using said summation source voltages $V_{sp\Sigma}$ and $V_{sn\Sigma}$ calculated respectively by summation of said source voltages $V_{sp}$ and $V_{sn}$ in (d) of each SM in that valve, wherein in said MMC valve as applied to relatively large MMC systems, the steps (a) to (e) above together enable parallel simulation-calculation thereby accelerating/increasing simulation speed, still keeping model detail and precision, in both real time applications and non-real-time applications.

2. The method as in claim 1, wherein said connected SMs are series connected and wherein the step of using a programmed computing unit comprises using a computing unit chosen from a group consisting of a CPU, FPGA, GPU and a combination thereof.

3. The method as in claim 1 wherein the step of compiling values of said source voltages $V_{sp}$ and $V_{sn}$ is done by using said predetermined table for said different modes, said different modes being caused by "open and close" positions of said switches in each said SM.

4. The method as in claim 3, including the step of programming said computing unit to handle a plurality of said SMs each SM including a half bridge circuit, each comprising two controlled switches.

5. The method as in claim 4, including the step of programming said computing unit to handle controlled switches that are in the form of insulated gate bipolar transistors (IGBT).

6. The method as in claim 3, including the step of programming said computing unit to handle a plurality of said SMs, each SM including a full bridge circuit comprising four controlled switches.

7. The method as in claim 6 wherein the step of representing each of said SMs comprises representing double clamp submodules (DCSM).

8. The method as in claim 1 wherein the step of compiling values of said source voltages $V_{sp}$ and $V_{sn}$ is done for a stack of half bridge, full bridge, double clamped or other SMs by using the predetermined table for said different modes, said different modes being caused by "open and close" positions of said switches in each SM.

9. The method as in claim 1 wherein the step (c) for solving a predetermined capacitor-voltage equation to arrive at the capacitor voltage $V_c$ comprises solving the equation $$V_c = \frac{1}{C_{SM}} \int i_c dt = \frac{1}{C_{SM}} \int \left( k * i_{val} - \frac{V_c}{R_{disc}} \right) dt$$

where $C_{SM}$ is the SM capacitance; $i_{val}$ is the valve current; $R_{disc}$ is the discharge resistance; and k is a variable that depends on whether the valve current is flowing through the capacitor.

10. In an electronic simulator of the type that uses a computing unit and a connected input/output interface, said simulator comprising a simulation model of a modular multilevel converter (MMC) system including at least one MMC valve with AC input and wired to produce different levels of DC output, said MMC valve including a plurality of series-connected converter submodules (SM), each SM comprising at least two controlled switches, a capacitor and auxiliary switches, a computerized method using a programmed computing unit for simulating said MMC system, said computerized method comprising the steps of:

(a) ascertaining a status of each of said SMs chosen from Full Bridge SM and Double Clamp SM configurations and including Half Bridge SM configuration that comprise: at least insert mode, bypass mode, diode mode and fault mode, (b) representing each of said SMs by an equivalent circuit for each said mode according to a current-direction of said DC output, each said equivalent circuit including series connected components selected from (i) an ideal diode (ii) diode forward conduction voltage $V_{fd}$ (iii) switch forward conduction voltage $V_{fk}$ and (iv) voltage $V_c$ of said capacitor, (c) solving a predetermined capacitor voltage equation to arrive at the capacitor voltage $V_c$ and, (d) compiling voltage values of positive source voltage $V_{sp}$, for path of positive current direction, and negative source voltage $V_{sn}$ for path of negative current direction for said different modes of each said SM by using capacitor voltage values $V_c$, wherein the step of using a programmed computing unit comprises using a computing unit chosen from a group consisting of a CPU, FPGA, GPU and a combination thereof and wherein the step of compiling values of said source voltages $V_{sp}$ and $V_{sn}$ is done by using a predetermined table for different states of said switches, said different states being chosen from said SM configurations, wherein in said MMC valve as applied to relatively large MMC systems, the steps (a) to (d) above together enable parallel simulation-calculation thereby accelerating/increasing simulation speed, still keeping model detail and precision, in both real time applications and non-real-time applications.

11. Computerized electronic apparatus comprising an electronic simulator of the type that uses a computing unit and a connected input/output interface, said simulator comprising a simulation model of a modular multilevel converter (MMC) system including at least one MMC valve with AC input and wired to produce different levels of DC output, or alternatively a DC input and wired to produce different levels of AC output, said MMC valve including a plurality of connected converter submodules (SMs) connected to form known configurations, each SM comprising at least two controlled switches, a capacitor and auxiliary switches, said electronic apparatus being configured to use a programmed computing unit for simulating said MMC system, said electronic apparatus comprising:

(a) computerized means for ascertaining a status of each of said SMs chosen from SM configurations including Full Bridge SM and Double Clamp SM configurations and further including Half Bridge SM configuration, each said SM configuration comprising at least insert mode, bypass mode, diode mode and fault mode of operation, (b) computerized means for solving a predetermined capacitor-voltage-equation to arrive at a capacitor voltage $V_c$;

computerized means using a predetermined table for obtaining values of positive source voltage $V_{sp}$ for path of positive current direction, and negative source voltage $V_{sn}$ for path of negative current direction for each of said different modes of operation of each SM by using capacitor voltage value $V_c$ of said capacitor, (c) computerized means for representing each of said SMs by an equivalent circuit for each of said modes according to a current-direction of said DC output, each said equivalent circuit including series connected components selected from (i) an ideal diode (ii) diode forward conduction voltage $V_{fd}$ (iii) switch forward conduction voltage $V_{fk}$ and (iv) voltage $V_c$ of said capacitor, (c) means for solving a predetermined capacitor-voltage-equation to arrive at the capacitor voltage $V_c$, (d) said programmed computing unit including computing means configured for using a general SM equivalent circuit to represent each of said four operating modes, including means for obtaining summation source voltage values $V_{sp\Sigma}$ and $V_{sn\Sigma}$ by summation of said source voltages $V_{sp}$ and $V_{sn}$, and, wherein (e) said computing means is configured for choosing/using an equivalent circuit to represent a MMC valve with summation values of source voltages $V_{sp\Sigma}$ and $V_{sn\Sigma}$ calculated respectively by summation of said source voltages $V_{sp}$ and $V_{sn}$ in (d) of each SM in that valve, wherein in said MMC valve as applied to relatively large MMC systems, said means (a) to (e) above together enable parallel simulation-calculation thereby accelerating/increasing simulation speed, still keeping model detail and precision, in both real time applications and non-real-time applications.

12. Apparatus as in claim 11, wherein some of said SMs are series connected and wherein said programmed computing unit comprises a computing means chosen from a group consisting of a CPU, FPGA, GPU and a combination thereof.

13. Apparatus as in claim 11 wherein said computing means is configured for compiling values of said source voltages $V_{sn}$ and $V_{sn}$ for said different modes by using a said predetermined table for different states of said switches, said different states being caused by "open and close" positions of said switches in each SM.

14. Apparatus as in claim 13, wherein said computing means is programmed to handle a plurality of said SMs each SM including a half bridge circuit, each comprising two controlled switches.

15. Apparatus as in claim 14, wherein said computing means is programmed to handle controlled switches that are in the form of insulated gate bipolar transistors (IGBT).

16. Apparatus as in claim 13, wherein said computing means is programmed to handle a plurality of said SMs, each SM including a full bridge circuit comprising four controlled switches.

17. Apparatus as in claim 13, wherein said computing means is configured to handle each of said SMs comprising double clamp submodules (DCSM).

18. Apparatus as in claim 11 wherein said computing means is configured to compile values of said source voltages $V_{sp}$ and $V_{sn}$ for a stack of half bridge, full bridge, double clamped or other SMs by using a predetermined table for different modes of each said SM configuration.

19. Apparatus as in claim 11 wherein said means (c) is configured for solving a predetermined capacitor-voltage equation to arrive at the capacitor voltage $V_c$ and comprises means for solving the equation $$V_c = \frac{1}{C_{SM}} \int i_c dt = \frac{1}{C_{SM}} \int \left(k * i_{val} - \frac{V_c}{R_{disc}}\right) dt$$

where $C_{SM}$ is the SM capacitance; $i_{val}$ is the valve current; $R_{disc}$ is the discharge resistance; and k is a variable that depends on whether the valve current is flowing through the capacitor.

20. Programmed electronic apparatus comprising an electronic simulator of the type that uses a computing unit and a connected input/output interface, said electronic simulator comprising a simulation model of a modular multilevel converter (MMC) system including at least one MMC valve with AC/DC input and wired to produce different levels of DC/AC output, said MMC valve including a plurality of series-connected converter submodules (SMs), each SM comprising at least two controlled switches, a capacitor and auxiliary switches, said electronic apparatus using a programmed computing unit/means for simulating said MMC system, said electronic apparatus comprising:
  (a) means for ascertaining a status of each of said SMs chosen from SM configurations including Full Bridge SM and Double Clamp SM configurations and further including a Half Bridge SM configuration that comprise at least insert mode, bypass mode, diode mode and fault mode,
  (b) programmed means for representing each of said SMs by an equivalent circuit for each said mode according to a current-direction of said DC output, each said equivalent circuit including series connected components selected from (i) an ideal diode (ii) diode forward conduction voltage $V_{fd}$ (iii) switch forward conduction voltage $V_{fk}$ and (iv) voltage $V_c$ of said capacitor,
  (c) said programmed computing unit being configured for solving a predetermined capacitor voltage equation to arrive at said capacitor voltage $V_c$ and,
  (d) wherein said programmed computing unit includes a programmed computing means chosen from a group consisting of a CPU, FPGA, GPU and a combination thereof and wherein said programmed computing unit is configured for compiling values of positive source voltage $V_{sp}$ for path of positive current direction, and negative source voltage $V_{sn}$ for path of negative current direction by using a predetermined table and said capacitor voltage $V_c$ for said different modes of operation of each said SM configuration,
wherein in said MMC valve as applied to relatively large MMC systems, said means (a) to (d) above are connected together to enable parallel simulation-calculation thereby accelerating/increasing simulation speed, still keeping model detail and precision, in both real time applications and non-real-time applications.

\* \* \* \* \*